(12) United States Patent
Ko et al.

(10) Patent No.: US 10,804,239 B2
(45) Date of Patent: Oct. 13, 2020

(54) APPARATUS FOR MOUNTING CONDUCTIVE BALL

(71) Applicant: PROTEC CO., LTD., Gyeonggi-do (KR)

(72) Inventors: Youn Sung Ko, Chungcheongnam-do (KR); Yoshiaki Yukimori, Kanagawa (JP)

(73) Assignee: PROTEC CO., LTD., Gyeonggi-Do (KR)

( * ) Notice: Subject to any disclaimer, the term of this patent is extended or adjusted under 35 U.S.C. 154(b) by 83 days.

(21) Appl. No.: 16/361,230

(22) Filed: Mar. 22, 2019

(65) Prior Publication Data

US 2020/0144219 A1    May 7, 2020

(30) Foreign Application Priority Data

Nov. 7, 2018  (KR) ........................ 10-2018-0135515

(51) Int. Cl.
| | | |
|---|---|---|
| *B23K 3/00* | (2006.01) | |
| *H01L 23/00* | (2006.01) | |
| *H01L 21/67* | (2006.01) | |
| *B23K 3/06* | (2006.01) | |
| *B23K 3/08* | (2006.01) | |

(52) U.S. Cl.
CPC ............ *H01L 24/75* (2013.01); *B23K 3/0623* (2013.01); *B23K 3/082* (2013.01); *H01L 21/67288* (2013.01); *H01L 2224/756* (2013.01); *H01L 2224/7565* (2013.01)

(58) Field of Classification Search
CPC ............... H01L 24/75; H01L 21/67288; H01L 2224/756; H01L 2224/7565; H01L 24/742; H01L 24/11; H01L 24/81; H01L 24/10; B23K 3/0623; B23K 35/0244; B23K 1/0016; B23K 1/203; B23K 3/08
USPC .................. 228/245–246, 56.3, 41, 206, 223
See application file for complete search history.

(56) References Cited

U.S. PATENT DOCUMENTS

| | | | | | |
|---|---|---|---|---|---|
| 5,816,481 | A | * | 10/1998 | Economy ............ | H01L 21/4853 228/207 |
| 5,839,191 | A | * | 11/1998 | Economy ............ | H01L 21/4853 29/843 |
| 6,268,275 | B1 | * | 7/2001 | Cobbley ............. | H01L 21/6835 228/245 |
| 6,533,159 | B1 | * | 3/2003 | Cobbley .............. | H05K 3/3478 228/20.1 |

(Continued)

FOREIGN PATENT DOCUMENTS

| | | |
|---|---|---|
| JP | H05299424 | 11/1993 |
| JP | 2000294681 | 10/2000 |

(Continued)

*Primary Examiner* — Kiley S Stoner
(74) *Attorney, Agent, or Firm* — JCIPRNET

(57) ABSTRACT

Provided is an apparatus for mounting a conductive ball, and more particularly, an apparatus for mounting a conductive ball, whereby defects during a process of mounting a conductive ball on a substrate by using a mounting hole formed in a mask may be prevented, and a conductive ball having a small size may also be effectively mounted on the substrate. According to the apparatus for mounting a conductive ball, a process of mounting a conductive ball may be performed by preventing deformation of a mask, thus achieving a high quality of the process without missing any conductive balls.

13 Claims, 3 Drawing Sheets

(56) References Cited

U.S. PATENT DOCUMENTS

| | | | |
|---|---|---|---|
| 6,604,673 B1* | 8/2003 | Bourrieres | B23K 3/0607 228/246 |
| 6,769,596 B1* | 8/2004 | Alghouli | B23K 3/0623 228/119 |
| 8,074,867 B2 | 12/2011 | Niizuma | |
| 8,104,663 B2* | 1/2012 | Ishikawa | H01L 24/742 228/41 |
| 2002/0058406 A1* | 5/2002 | Mukuno | B23K 3/0623 438/626 |
| 2003/0127501 A1* | 7/2003 | Cheng | B23K 3/0623 228/246 |
| 2005/0133573 A1* | 6/2005 | Bayot | B23K 3/0638 228/207 |
| 2006/0244155 A1 | 11/2006 | Niizuma | |
| 2009/0072011 A1* | 3/2009 | Sakaguchi | H01L 24/742 228/245 |
| 2009/0072012 A1* | 3/2009 | Sakaguchi | B23K 3/0623 228/246 |
| 2009/0294516 A1* | 12/2009 | Sawa | B23K 3/0692 228/246 |
| 2013/0171816 A1* | 7/2013 | Jin | B23K 3/0623 438/613 |
| 2013/0306709 A1* | 11/2013 | Oh | B23K 3/0623 228/41 |
| 2015/0097024 A1* | 4/2015 | Kurihara | B23K 1/203 228/223 |
| 2015/0125999 A1* | 5/2015 | Lee | H01L 23/49816 438/127 |
| 2015/0230346 A1* | 8/2015 | Tanno | B23K 1/0016 228/248.1 |

FOREIGN PATENT DOCUMENTS

| | | | | |
|---|---|---|---|---|
| JP | 2006186140 | | 7/2006 | |
| JP | 2008282872 A | * | 11/2008 | H01L 24/742 |
| JP | 2016154193 | | 8/2016 | |

* cited by examiner

APPARATUS FOR MOUNTING CONDUCTIVE BALL

CROSS-REFERENCE TO RELATED APPLICATION

This application claims the benefit of Korean Patent Application No. 10-2018-0135515, filed on Nov. 7, 2018, in the Korean Intellectual Property Office, the disclosure of which is incorporated herein in its entirety by reference.

BACKGROUND

1. Field of the Invention

One or more embodiments relate to an apparatus for mounting a conductive ball, and more particularly, to an apparatus for mounting a conductive ball, whereby defects during a process of mounting a conductive ball on a substrate by using a mounting hole formed in a mask may be prevented, and a conductive ball having a small size may also be effectively mounted on the substrate.

2. Description of the Related Art

When mounting, for example, a semiconductor device such as a large-scale integration (LSI) device, a liquid-crystal display (LCD), a conductive ball such as a solder ball is frequently used for electrical connection.

A conductive ball has a very small particle shape having a diameter of about 1 mm or less. A conductive ball is mounted on a substrate and used to electrically mount the substrate. In general, a mask in which a mounting hole is formed disposed on a substrate printed with a flux, and a conductive ball is transferred to the substrate via the mounting hole to temporarily adhere the conductive ball via the flux to thereby mount the conductive ball on the substrate.

Recently, semiconductor devices have become highly integrated and compact, and the size of conductive balls has also been reduced significantly. In addition, the number of conductive balls mounted using a mask has been increased.

Accordingly, an apparatus for mounting a conductive ball to effectively perform a process of mounting tens of thousands or hundreds of thousands of conductive balls each having a size less than 100 μm is required.

When mounting conductive balls having a small size as above, a mask having a similar thickness to the size of the conductive balls is used. When using a thin mask as described above, the possibility of a defect that conductive balls are not mounted in mounting holes of the mask increases. In addition, time for mounting conductive balls in mounting holes also increases.

Thus, there is the need for an apparatus for mounting a conductive ball, which is capable of mounting a conductive ball in a mounting hole of a mask at a high speed and reducing the possibility of a defect that conductive balls are not mounted in mounting holes at the same time.

Using a thin mask is likely to cause deformation of the mask such as bending. A substrate disposed under the mask also has an easily bendable structure. When the substrate and the mask are bent, a gap is formed between the substrate and the mask and a defect that a conductive ball mounted in a mounting hole escaping through the gap may be caused. The missing of conductive balls out of the gap between the substrate and the mask that may be present around the mounting hole can also be a cause of a process defect. Also, due to this gap, a defect that two conductive balls are mounted in one mounting hole may be caused.

Thus, an apparatus for mounting a conductive ball, capable of preventing deformation of a mask and thus defects, and also quickly mounting multiple small-sized conductive balls on a substrate by using the mask is required.

SUMMARY

One or more embodiments include an apparatus for mounting a conductive ball, whereby a small-sized conductive ball may be quickly mounted on a substrate without missing the conductive balls.

Additional aspects will be set forth in part in the description which follows and, in part, will be apparent from the description, or may be learned by practice of the presented embodiments.

According to one or more embodiments, an apparatus for mounting a conductive ball, includes: a mask including a plurality of mounting holes formed such that a plurality of conductive balls is respectively mounted in the plurality of mounting holes; a support plate supporting the mask to prevent deformation of the mask by blocking a lower portion of each of the plurality of mounting holes by contacting a lower surface of the mask; a mounting unit mounting the plurality of conductive balls in the plurality of mounting holes of the mask while the mask is being supported by the support plate; a holding unit contacting an upper surface of the mask to maintain the conductive balls respectively mounted in the mounting holes of the mask, in a state of being mounted in the mounting holes; a transporting unit placing the substrate below the mask by transporting at least one of the mask, the support plate, and a substrate that is coated with a flux, while the holding unit maintains the conductive balls in the state of being mounted in the mounting holes of the mask; and a controller controlling operation of the mounting unit, the holding unit, and the transporting unit.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, an apparatus for mounting a conductive ball, according to the present disclosure will be described with reference to the drawings.

Figure 1:
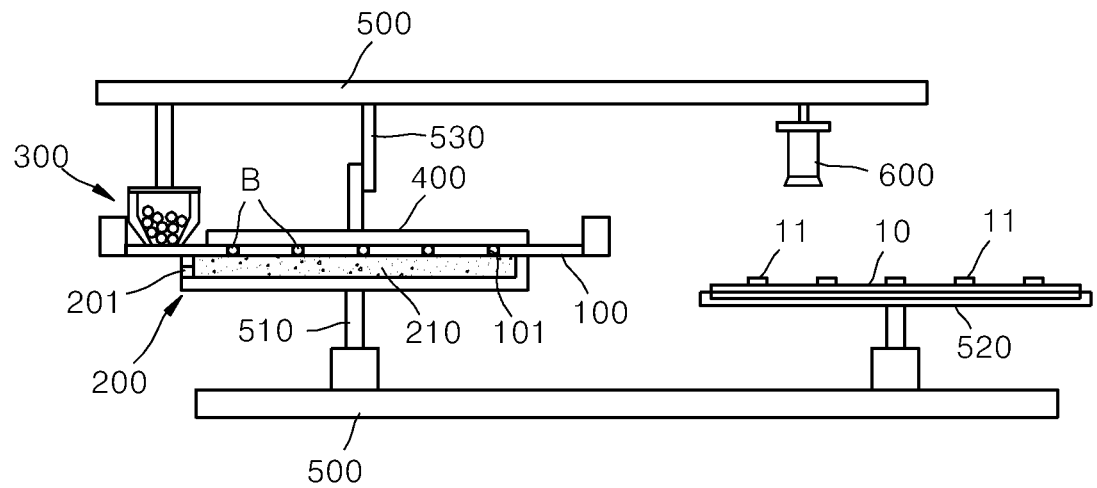
FIG. 1 is a structural diagram of an apparatus for mounting a conductive ball, according to an embodiment of the present disclosure.

FIG. 1 is a structural diagram of an apparatus for mounting a conductive ball, according to an embodiment of the present disclosure.

Referring to FIG. 1, the apparatus for mounting a conductive ball, according to the present embodiment, includes a mask 100, a support plate 200, a mounting unit 300, and a holding unit 400.

The mask 100 is in the form of a thin and flat metal plate. A plurality of mounting holes 101 are formed in the mask 100. The mask 100 is used to mount conductive balls B on a substrate 10. The mounting holes 101 are formed in the mask 100 at positions corresponding to positions where conductive balls B are to be mounted on the substrate 10. To prevent two or more conductive balls B from being mounted in one mounting hole 101 of the mask 100, the mask 100 has a thickness that is approximately similar to or slightly less than a diameter of the conductive balls B.

The support plate 200 is placed under the mask 100. The support plate 200 is mounted to be movable relative to the mask 100 by using a transporting unit 500 which will be described later. The support plate 200 is placed at a position in contact with a lower surface of the mask 100 to support the lower surface of the mask 100. The mask 100 has a relatively broad area compared to its thickness, and is thus likely to deform downwards by its own weight. The support plate 200 has a function of preventing deformation of the mask 100 by supporting the mask 100 while being in contact with the lower surface of the mask 100. In addition, the support plate 200 contacting the lower surface of the mask 100 thereby blocks lower portions of the mounting holes 101 formed in the mask 100. As a result, the conductive balls B mounted in the mounting holes 101 of the mask 100 do not escape downwards but are kept accommodated in the mounting holes 101 due to the support plate 200.

The support plate 200 according to the present embodiment includes a light-emitting portion 210 and a first adsorption member 210 formed of a porous material. The first adsorption member 210 has a planar plate shape and is placed to contact the lower surface of the mask 100. When a vacuum pump is connected to the first adsorption member 210, a flow of the air flowing downwards under the mounting holes 101 induces the conductive balls B to be mounted in the mounting holes 101. In addition, the first adsorption member 210 has a function of preventing the conductive balls B from escaping the mounting holes 101 and of maintaining the conductive balls B as being accommodated in the mounting holes 101 and attached to the first adsorption member 210 in that accommodated state. According to the present embodiment, the first adsorption member 210 of the support plate 200 is formed of a transparent material. The light-emitting portion 201 of the support plate 200 is formed of a light-emitting diode (LED) lamp. When the light-emitting portion 201 emits light, the light is transmitted through the first adsorption member 210 which is formed of a transparent material, thereby illuminating the lower surface of the mask 100 and the mounting holes 101.

The mounting unit 300 is placed on the mask 100. The mounting unit 300 is transported horizontally via the transporting unit 500. In the present embodiment, the mounting unit 300 having a cyclone head shape is used. A cyclone head has a structure including a cylindrical chamber accommodating a plurality of conductive balls B, and a compressed air is jetted into the chamber. In the present embodiment, a cyclone head having various well-known structures may be used as the mounting unit 300. When the mounting unit 300 is moved along an upper surface of the mask 100, the conductive balls B accommodated in the chamber of the mounting unit 300 are moved in an arbitrary direction and then mounted in the mounting holes 101 under the mounting unit 300. According to circumstances, a mounting unit having a different structure from a cyclone head may also be used. A mounting unit including a brush or a squeegee moving relative to the mask 100 may also be used to mount the conductive balls B in the mask 100.

The holding unit 400 is placed on the mask 100. The holding unit 400 is installed to be transported horizontally and vertically via the transporting unit 500. The holding unit 400 is in contact with the upper surface of the mask 100 to maintain the conductive balls B as being mounted in the mounting holes 101. That is, even when the support plate 200 under the mask 100 is moved and thus does not support the lower surface of the mask 100 anymore, the holding unit 400 may keep the conductive balls B as being accommodated in the mounting holes 101 and prevent the conductive balls B from falling downwards.

The holding unit 400 may have various structures. For example, an adsorption member having a similar structure to that of the first adsorption member 210 described above or an electrostatic chuck may be used as the holding unit 400. In the present embodiment, the holding unit 400 having a structure including an electrostatic chuck will be described as an example. The electrostatic chuck of the holding unit 400 performs a function of clamping an object by generating an electrostatic force via an electric power applied. In the present embodiment, the electrostatic chuck of the holding unit 400 may contact the upper surface of the mask 100 to clamp the mask 100 and the conductive balls B respectively accommodated in the mounting holes 101. When a controller eliminates the electrostatic force of the electrostatic chuck, the conductive balls B accommodated in the mounting holes 101 fall downwards.

The transporting unit 500 includes a support plate transporting unit 510, a holding unit transporting unit 530, and a substrate transporting unit 520. As described above, the support plate transporting unit 510 of the transporting unit 500 transports the support plate 200 relative to the mask 100. The holding unit transporting unit 530 of the transporting unit 500 transports the holding unit 400 relative to the mask 100. In addition, the substrate transporting unit 520 of the transporting unit 500 transports the substrate 10 relative to the mask 100 in horizontal and vertical directions.

In the present embodiment, the substrate transporting unit 520 moves the substrate 10 including a pad 11 coated with a flux used to attach the conductive balls B, under the mask 100. According to necessity, the substrate transporting unit 520 transports the substrate 10 at a close distance to the lower surface of the mask 100 of the substrate 10.

The transporting unit 500 also performs a function of transporting the mounting unit 300 and other elements such as an inspection camera 600 or the like.

The controller controls operations of main elements including the holding unit 400, the transporting unit 500, and the mounting unit 300 described above.

The inspection camera 600 is placed above the mask 100. The inspection camera 600 is installed to be movable by the transporting unit 500 in a desired direction. The inspection camera 600 captures an image of the mask 100 placed thereunder. The image captured using the inspection camera 600 is transmitted to the controller and used in inspecting a mounting state of the conductive balls B in the mounting holes 101.

A separation unit separates the conductive balls B attached to the holding unit 400, from the holding unit 400. As described above, the conductive balls B are attached to the holding unit 400 via the electrostatic chuck, and when operation of the electrostatic chuck is stopped, the conductive balls B are separated from the holding unit 400. The separation unit 530 facilitates separation of the conductive ball B from the holding unit 400.

According to the present embodiment, the holding unit transporting unit 530 of the transporting unit 500 performs a function of the separation unit. After an electrostatic force of the electrostatic chuck is eliminated, when the holding unit transporting unit 530 horizontally slides the holding unit 400 with respect to the mask 100, the conductive balls B attached to the holding unit 400 are easily separated from the holding unit 400.

Hereinafter, an operation of the apparatus for mounting a conductive ball configured as described above will be described.

Figure 2:
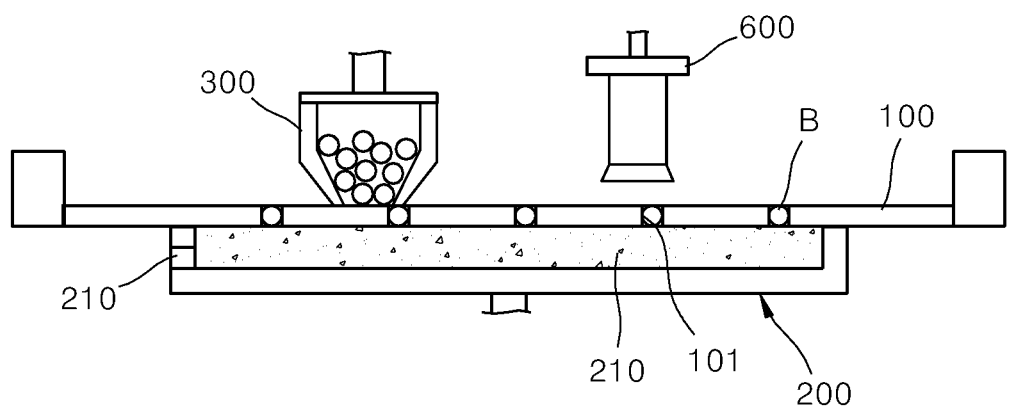
FIGS. 2 through 5 are views for describing an operation of the apparatus for mounting a conductive ball, illustrated in FIG. 1.

First, as illustrated in FIG. 2, the transporting unit 500 is operated to bring the support plate 200 into contact with the lower surface of the mask 100. In this state, the controller operates the mounting unit 300 to respectively mount the conductive balls B in the mounting holes 101 of the mask 100.

By bringing the support plate 200 into contact with the lower surface of the mask 100 as described above, bending or warpage of the mask 100 may be prevented. As semiconductor processes have become sophisticated, conductive balls B having a size smaller than 100 μm are frequently used. In this case, even a very little deformation of the mask 100 may cause a defect of a process of mounting conductive balls B. According to the present disclosure, the mounting unit 300 is operated while supporting the lower surface of the mask 100 by using the support plate 200, and thus, bending or warpage of the mask 100 may be prevented, and the process of mounting conductive balls B may be effectively performed at the same time. Thus, omitting the conductive balls B when mounting the conductive balls B in the mounting holes 101 may be prevented or the conductive balls B mounted in the mounting holes 101 may be prevented from escaping through a gap generated due to deformation of the mask 100.

In addition, as the lower surface of the mask 100 is adsorbed using the first adsorption member 210 of the support plate 200 as described above, the mask 100 maintains a flat state while being closely adhered to an upper surface of the support plate 200. As vacuum applied to the first adsorption member 210 is transferred not only to the lower surface of the mask 100 but also to the mounting holes 101, the conductive balls B are even more effectively mounted in the mounting holes 101. Once the conductive balls B are mounted in the mounting holes 101, the conductive balls B are continuously adsorbed by an upper surface of the first adsorption member 210 via vacuum. Thus, even when the conductive balls B collide with a compressed air applied by the mounting unit 300 or with other conductive ball B, the conductive balls B do not escape out of the mounting holes 101. Consequently, time for performing a process of mounting the conductive balls B in the mounting holes 101 of the mask 100 may be reduced.

Figure 3:
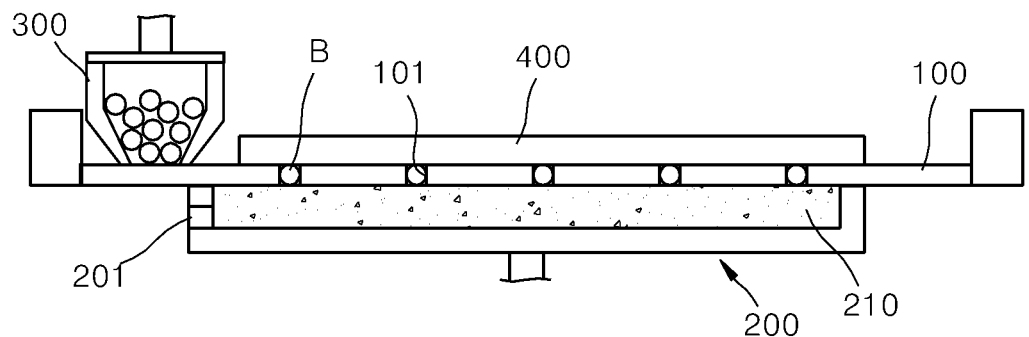

When the mounting unit 300 completes the process of mounting the conductive balls B, the controller moves the mounting unit 300 to a side of the mask 100 as illustrated in FIG. 3 to put the same on standby. Next, the controller operates the light-emitting portion 201 to turn on a LED lamp. The light generated in the light-emitting portion 201 is illuminated to the lower surface of the mask 100 via the first adsorption member 210 formed of a transparent material.

The controller operates the transporting unit 500 to transport the inspection camera 600 to a position above the mask 100, and the inspection camera 600 captures an image of the mask 100. When a conductive ball B is not mounted in some of the mounting holes 101 of the mask 100, light generated in the light-emitting portion 201 is illuminated upwards through the mounting holes 101.

The controller inspects a mounting state of the conductive balls B mounted in the mounting holes 101 of the mask 100 based on the image captured using the inspection camera 600. The controller may easily inspect whether the mounting holes 101 are empty based on whether bright images of the mounting holes 101 are captured. When the controller determines a position of a mounting hole 101 that is empty, the mounting unit 300 is operated again to mount a conductive ball B at that position. The controller operates the transporting unit 500 to transport the mounting unit 300 to the position of the mounting hole 101 that is empty, and operates the mounting unit 300 to mount a conductive balls B also in the mounting hole 101 that is empty.

As described above, by using the first adsorption member 210 of a transparent material, the light-emitting portion 201, and the inspection camera 600, whether the conductive balls B are mounted may be inspected easily. In addition, a conductive ball B may be immediately filled in the mounting holes 101 that are empty. Whether the conductive balls B are mounted or not may be immediately inspected after operation of the mounting unit 300 as described above, and thus, the quality of the mounting process of conductive balls B and a process rate of the process may be remarkably improved according to the present disclosure.

When the mounting process of the conductive balls B in the mounting holes 101 is completed as described above, a process of maintaining the conductive balls B as being mounted in the mounting holes 101 by using the holding unit 400 is performed as illustrated in FIG. 3. First, the transporting unit 500 transports the mounting unit 300 to an edge of the mask 100. Then the controller brings the holding unit 400 into contact with the upper surface of the mask 100 by using the transporting unit 500. Then the controller stops operation of the first adsorption member 210 before or right after operating the holding unit 400.

When the controller operates the electrostatic chuck of the holding unit 400, due to an electrostatic force generated in the electrostatic chuck, the mask 100 and the conductive balls B are closely adhered to a lower surface of the holding unit 400. As the controller has stopped operation of the first adsorption member 210, the mask 100 and the conductive balls B that are closely adhered to the support plate 200 via the first adsorption member 210 are spontaneously closely adhered to the lower surface of the holding unit 400. Here, the conductive balls B are still mounted in the mounting hole 101 of the mask 100 and attached to the electrostatic chuck in that state. As the mask 100 is closely adhered to the electrostatic chuck, there is no gap through which the conductive balls B may escape, in an upper portion of the mounting holes 101. As a result, the conductive balls B are maintained as being firmly attached to the holding unit 400. Even when the transporting unit 500 separates the support plate 200 from the lower surface of the mask 100, the conductive balls B do not move from the mask 100.

Figure 4:
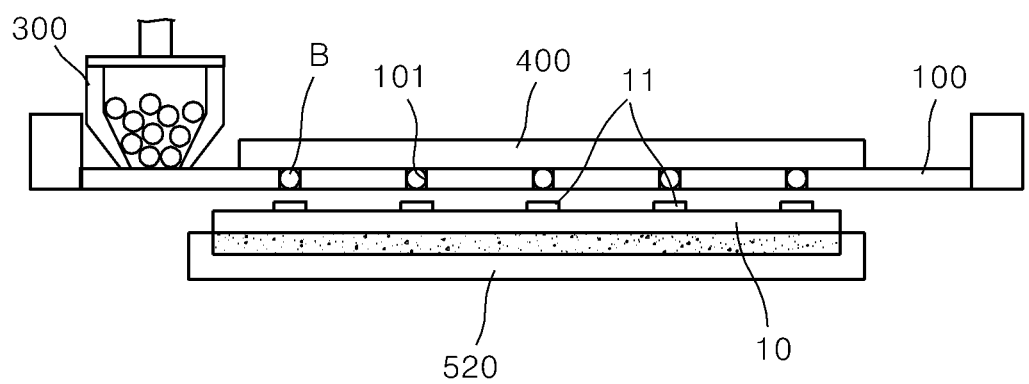

Next, as illustrated in FIG. 4, the controller moves the support plate 200 to another position and transports the substrate 10 to a relatively close position to the lower surface of the mask 100. Here, the controller controls the substrate transporting unit 520 of the transporting unit 500 to align the substrate 10 with respect to the mask 100 in a horizontal direction and raise the substrate 10 to a close position to the lower surface of the mask 100. The substrate transporting unit 520 moves the substrate 10 relative to the mask 100 by clamping the substrate 10 by adsorbing a lower surface of the substrate 10. Here, the substrate transporting unit 520 may move the substrate 10 to a position where the substrate 10 is as close as possible to the mask 100 but does not contact the mask 100.

Figure 5:
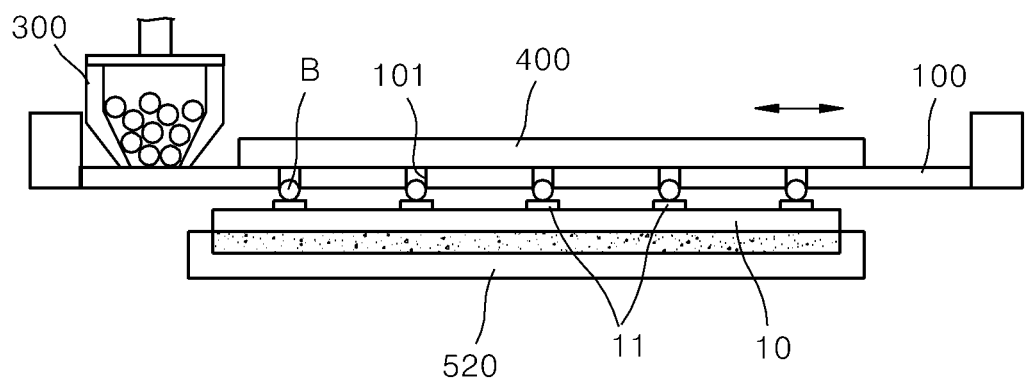

Next, as illustrated in FIG. 5, an operation of dropping the conductive balls B mounted in the mounting holes 101 and attaching the conductive balls B to the substrate 10 is performed. When the controller stops operation of the holding unit 400, the electrostatic force of the electrostatic chuck does not act anymore. The conductive balls B attached to the holding unit 400 pass by the mounting holes 101 to fall onto the substrate 10. As a flux is previously coated on the pad 11 of the substrate 10 to which the conductive balls B are to be attached, the conductive balls B fallen on the substrate 10 are temporarily adhered to the substrate 10 by the flux. The conductive balls B are heated in a reflow process together with the substrate 10 to be adhered to the substrate 10.

Due to the electrostatic force remaining on the holding unit 400 or an electrostatic force that is generated between the holding unit 400 and the conductive balls B, some conductive balls B may not be separated from the holding unit 400 but remain thereon. Particularly when conductive balls B having a very small size of 100 μm or less are used, this phenomenon is likely to occur frequently.

A separation unit may be used when the conductive balls B are not easily separated from the holding unit 400.

The separation unit is used to separate the conductive balls B from the holding unit 400. As a separation unit separating the conductive balls B from the holding unit 400, various elements may be used. For example, the conductive balls B may be separated from the holding unit 400 by jetting a compressed air between the mask 100 and the holding unit 400. In addition, a separation unit applying a small impact to the holding unit 400 may be used.

In the present embodiment, the holding unit transporting unit 530 transporting the holding unit 400 is used as a separation unit 530 and will be described as an example. When the controller stops operation of the holding unit 400, the conductive ball B falls onto the substrate 10. As illustrated in FIG. 5, the holding unit 400 is finely slid horizontally with respect to the mask 100 by using the holding unit transporting unit 530. Falling of the conductive balls B onto the substrate 10 through the mounting holes 101 is accelerated by sliding of the holding unit 400. The conductive balls B are here accommodated in the mounting holes 101, and thus do not move even when the holding unit 400 is moved horizontally. The conductive balls B are maintained in the mounting holes 101 and then fall downwards. The conductive balls B that have fallen downwards by their own weight are attached to the substrate 10. By using the separation unit 530 as described above, a quality of the operation of attaching the conductive balls B to the substrate 10 and the operational speed may be improved. That is, a defect ratio of the process of mounting conductive balls B may be significantly reduced.

According to the present disclosure, the operation of mounting conductive balls B in the mounting holes 101 is performed while the mask 100 is supported using the support plate 200 which has a flat plate shape, and thus, the operation of mounting the conductive balls B may be performed while preventing deformation of the mask 100 such as bending or warpage. By preventing deformation of the mask 100, defects in the operation of mounting the conductive balls B may be effectively prevented, for example, when mounting conductive balls B having a very small size or when the mask 100 having a small thickness is used.

In addition, also when the support plate 200 does not support the lower surface of the mask 100 as illustrated in FIG. 4, the holding unit 400 holds and supports the mask 100 and the conductive balls B from above, thereby preventing deformation of the mask 100. Accordingly, the conductive balls B mounted in the mounting holes 101 may be prevented from escaping.

In addition, as illustrated in FIG. 5, the conductive balls B are bonded to the substrate 10 while supporting the lower surface of the substrate 10 in a flat state by using the substrate transporting unit 520, and thus, deformation of the substrate 10 is also prevented. Accordingly, leakage of the conductive balls B mounted in the mounting holes 101 without being attached to the pad 11 of the substrate 10 may be prevented.

While the present disclosure has been described with reference to preferred embodiments, the scope of the present disclosure is not limited to the above described and illustrated structures.

For example, the first adsorption member 210 of the support plate 200 is described above as being formed of a transparent material, a first adsorption member that is not transparent may also be used. In addition, an apparatus for mounting a conductive ball according to the present disclosure may also be configured such that a support plate does not include the first adsorption member 210 but simply supports the lower surface of the mask 100. An apparatus for mounting a conductive ball according to the present disclosure may also be configured by including a support plate that does not have an adsorption function but is partially formed of a transparent material to illuminate the mounting holes 101.

In addition, an apparatus for mounting a conductive ball according to the present disclosure may also be configured without including the inspection camera 600.

Figure 6:
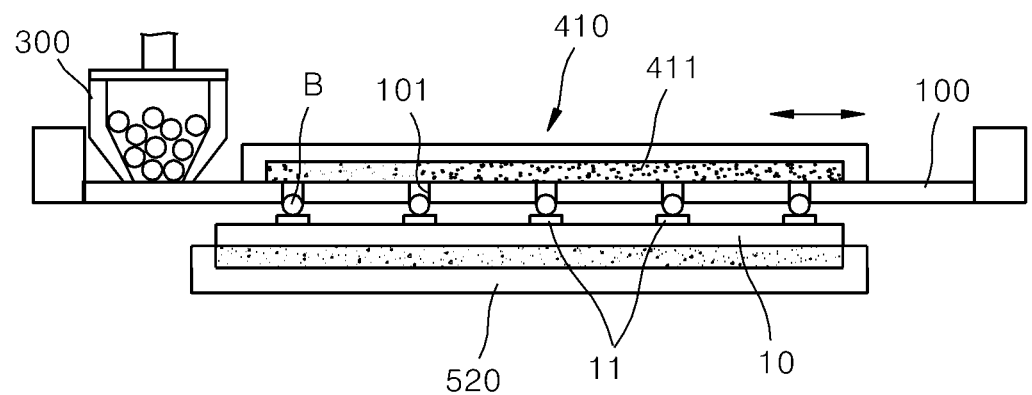
FIG. 6 is a view of an operation of the apparatus for mounting a conductive ball, illustrated in FIG. 1 and corresponding to FIG. 5, according to another embodiment of the present disclosure.

In addition, while the holding unit 400 including an electrostatic chuck to hold the mask 100 and the conductive balls B is described above, a holding unit 410 having a structure as illustrated in FIG. 6 may also be used. In this case, the holding unit 410 includes a second adsorption member 411 formed of a porous material. While being in contact with the upper surface of the mask 100, the second adsorption member 411 adsorbs, from above, conductive balls B mounted in mounting holes 101. That is, the holding unit 410 in the form as illustrated in FIG. 6 holds the mask 100 and the conductive balls B by adsorbing the mask 100 and the conductive balls B. In this case, when the substrate 10 is placed below the mask 100, the controller stops operation of the second adsorption member 411 of the holding unit 400 such that the conductive balls B mounted in the mounting holes 101 fall onto the substrate 10.

In addition, an apparatus for mounting a conductive ball may also be configured without a separation unit as described above, or an apparatus for mounting a conductive ball may be configured by including a separation unit having a different structure than the above-described one.

In addition, while the mounting unit 300 in the form of a cyclone head is described above as an example, an apparatus for mounting a conductive ball may also be configured to mount conductive balls B in mounting holes 101 of the mask 100 by using a mounting unit having a different structure.

In addition, while the substrate transporting unit 520 is described above as fixing and transporting the substrate 10 by adsorbing the lower surface of the substrate 10, a substrate transporting unit that fixes and transports the substrate 10 by using a different method other than adsorption may also be configured.

According to the apparatus for mounting a conductive ball according to the present disclosure, a process of mounting a conductive ball may be performed by preventing deformation of a mask, thus achieving a high quality of the process without missing any conductive balls.

In addition, according to the apparatus for mounting a conductive ball, according to the present disclosure, a process of mounting a conductive ball having a very small size, on a substrate, may be performed effectively.

What is claimed is:

1. An apparatus for mounting a conductive ball, the apparatus comprising:
    a mask comprising a plurality of mounting holes formed such that a plurality of conductive balls is mounted in the plurality of mounting holes;
    a support plate supporting the mask to prevent deformation of the mask by blocking a lower portion of each of the plurality of mounting holes by contacting a lower surface of the mask;
    a mounting unit mounting the plurality of conductive balls in the plurality of mounting holes of the mask while the mask is being supported by the support plate;
    a holding unit contacting an upper surface of the mask to maintain the conductive balls respectively mounted in the mounting holes of the mask, in a state of being mounted in the mounting holes;
    a transporting unit placing a substrate below the mask by transporting at least one of the mask, the support plate, and the substrate that is coated with a flux, while the holding unit maintains the conductive balls in the state of being mounted in the mounting holes of the mask; and
    a controller controlling operation of the mounting unit, the holding unit, and the transporting unit.

2. The apparatus of claim 1, wherein the holding unit comprises an electrostatic chuck clamping the conductive balls mounted in the mounting holes via an electrostatic force, and
    the controller stops operation of the electrostatic chuck of the holding unit when the substrate is placed below the mask such that the conductive balls mounted in the mounting holes fall onto the substrate.

3. The apparatus of claim 1, wherein the holding unit comprises a second adsorption member that is formed of a porous material and clamps, by vacuum adsorption, the conductive balls which are mounted in the mounting holes, and
    the controller stops operation of the second adsorption member of the holding unit when the substrate is placed below the mask such that the conductive balls mounted in the mounting holes fall onto the substrate.

4. The apparatus of claim 1, wherein the support plate comprises a first adsorption member that is formed of a porous material and adsorbs the conductive balls mounted in the mounting holes while the first adsorption member is in contact with the lower surface of the mask, and
    the controller stops operation of the first adsorption member when or before the holding unit operates in contact with the upper surface of the mask.

5. The apparatus of claim 4, wherein the first adsorption member of the support plate is formed of a transparent material.

6. The apparatus of claim 5, wherein the support plate includes a light-emitting portion that contacts the lower surface of the mask to transmit light to the mounting holes of the mask.

7. The apparatus of claim 6, further comprising an inspection camera capturing an image of the mask from above the mask to inspect a mounting state of the conductive balls mounted in the mounting holes of the mask,
    wherein the controller inspects a mounting state of the conductive balls mounted in the mounting holes of the mask by using the image captured using the inspection camera.

8. The apparatus of claim 1, wherein the holding unit operates such that the conductive balls mounted in the mounting holes are brought into contact with the holding unit,
    wherein the apparatus further comprises a separation unit separating, when the controller stops operation of the holding unit, the conductive balls from the holding unit such that the conductive balls fall onto the substrate.

9. The apparatus of claim 8, wherein the separation unit separates the conductive balls from the holding unit by jetting a compressed air between the mask and the holding unit.

10. The apparatus of claim 8, wherein the separation unit separates the conductive balls from the holding unit by moving the mask and the holding unit relative to each other in a horizontal direction.

11. The apparatus of claim 1, wherein the transporting unit comprises a support plate transporting unit transporting the support plate relative to the mask, a substrate transporting unit transporting the substrate relative to the mask, and a holding unit transporting unit transporting the holding unit relative to the mask.

12. The apparatus of claim 1, wherein the support plate is at least partially formed of a transparent material.

13. The apparatus of claim 1, wherein the mounting unit comprises a cyclone head jetting a compressed air to the plurality of conductive balls disposed in a chamber of the cyclone head to mount the plurality of conductive balls in the mounting holes of the mask.

* * * * *